US009488705B2

(12) United States Patent
Reykowski

(10) Patent No.: US 9,488,705 B2
(45) Date of Patent: Nov. 8, 2016

(54) WIRELESS LOCAL TRANSMIT COILS AND ARRAY WITH CONTROLLABLE LOAD

(75) Inventor: Arne Reykowski, Newberry, FL (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 480 days.

(21) Appl. No.: 14/233,274

(22) PCT Filed: Jul. 5, 2012

(86) PCT No.: PCT/IB2012/053439
§ 371 (c)(1),
(2), (4) Date: Jan. 16, 2014

(87) PCT Pub. No.: WO2013/011406
PCT Pub. Date: Jan. 24, 2013

(65) Prior Publication Data
US 2014/0225613 A1    Aug. 14, 2014

Related U.S. Application Data

(60) Provisional application No. 61/509,603, filed on Jul. 20, 2011.

(51) Int. Cl.
*G01V 3/00* (2006.01)
*G01R 33/36* (2006.01)
(Continued)

(52) U.S. Cl.
CPC ........... *G01R 33/36* (2013.01); *G01R 33/3628* (2013.01); *G01R 33/3642* (2013.01); *G01R 33/3692* (2013.01); *G01R 33/5612* (2013.01); *G01R 33/5659* (2013.01)

(58) Field of Classification Search
USPC ......................................................... 324/309
See application file for complete search history.

(56) References Cited

U.S. PATENT DOCUMENTS 6,788,056 B2 *  9/2004  Vaughan ............ G01R 33/3453
                                               324/318
7,649,353 B2 *  1/2010  Feiweier .............. G01R 33/288
                                               324/307

(Continued)

FOREIGN PATENT DOCUMENTS

| WO | 2008100546 A1 | 8/2008 |
| WO | 2009043034 A1 | 4/2009 |
| WO | 2011033400 A1 | 3/2011 |

OTHER PUBLICATIONS

Merkle, Hellmut et al "Transmit B1-Field Correction at 7T using Actively Tuned Coupled Inner Elements", Magnetic Resonance in Medicine, vol. 66, 2011, pp. 901-910.

(Continued)

*Primary Examiner* — Rodney Fuller

(57) ABSTRACT

A local radio frequency (RF) transmitting coil (26) of a magnetic resonance imaging system (5) has a plurality of coil elements (100). Each coil element (100) has an adjustable load (62) which is adjusted by a control unit (60) to adjust a transmitted $B_1$ field distribution. The load can be adjusted to shim for a uniform $B_1$ field distribution. Non-uniform $B_1$ field distributions can be selected to perform magnetic resonance sequences that use such $B_1$ field distributions, such as parallel imaging. The $B_1$ field distribution can be changed during the magnetic resonance sequence to track a moving region of interest, time division multiplex parallel imaging, and the like.

20 Claims, 6 Drawing Sheets

(51) Int. Cl.
    *G01R 33/561*     (2006.01)
    *G01R 33/565*     (2006.01)

(56) References Cited

U.S. PATENT DOCUMENTS

| | | | |
|---|---|---|---|
| 7,923,995 | B2 | 4/2011 | Schulz |
| 8,598,874 | B2 | 12/2013 | Saes |
| 2004/0012391 | A1 | 1/2004 | Vaughan |
| 2006/0054810 | A1 | 3/2006 | Grasslin |
| 2008/0007250 | A1 | 1/2008 | Wiggins |
| 2008/0157762 | A1* | 7/2008 | Weiss ............... G01R 33/34046 324/304 |
| 2008/0231280 | A1* | 9/2008 | Greim ................ G01R 33/341 324/318 |
| 2009/0128150 | A1 | 5/2009 | Ham |
| 2011/0084694 | A1 | 4/2011 | Waffenschmidt |

OTHER PUBLICATIONS

Sohn, S.M. et al "Electrically Auto-Tuned RF Coil Design", Proceedings of the International Society on Magnetic Resonance in Medicine, vol. 19, 2011, p. 3826.

Snyder, C.J. et al. "Using Piezoelectric Actuators for Remote Tuning of Transmit Coils", Proceedings of the International Society on Magnetic Resonance in Medicine, Jan. 2010, p. 1523.

Pavan, M. et al "A Modular Automatic Matching Network System", Proceedings of the International Society on Magnetic Resonance in Medicine, Jan. 2010, p. 647.

Stang, P. et al "An Extensible Transmit Array System using Vector Modulation and Measurement", Proceedings of the International Society on Magnetic Resonance in Medicine, vol. 16, 2008, p. 145.

Ibrahim, T.S. et al "Measuring RF Field Distributions in MR Coils with IR Sensors", Antennas and Propagation Society International Symposium, 2001, IEEE, Abstract.

* cited by examiner

WIRELESS LOCAL TRANSMIT COILS AND ARRAY WITH CONTROLLABLE LOAD

CROSS-REFERENCE TO PRIOR APPLICATIONS

This application is the U.S. National Phase application under 35 U.S.C. §371 of International Application No. PCT/IB2012/053439, filed on Jul. 5, 2012, which claims the benefit of U.S. Provisional Patent Application No. 61/509,603, filed on Jul. 20, 2011. These applications are hereby incorporated by reference herein.

The present application relates to the magnetic resonance arts, electronics arts, and related arts. Specifically, the present application relates to the powering, tuning, and decoupling of local radio frequency (RF) resonance coils.

A subject undergoing a magnetic resonance (MR) procedure such as an MR imaging procedure is typically positioned inside the bore of a bore type MR scanner. A static ($B_0$) magnetic field is generated in the bore, and radio frequency field ($B_1$) pulses are applied at a magnetic resonance frequency to excite resonance in dipoles in the subject. Surrounding the bore is a whole body coil which generates RF pulses in accordance with a selected imaging protocol. In some imaging procedures, local coils are placed next to the body in various locations to receive RF resonance signals and/or to generate RF pulses. When used in a transmit mode, the local coils focus RF pulses on a specific body part or location. Local RF transmit coils are typically powered by a power cable which may include communication cabling with the imaging system.

Others have used local coils which are inductively coupled to the whole body coil of an MR scanner. Most commonly, the whole body and the local coil are both birdcage coils. During manufacture, the whole body birdcage coil is tuned by manually adjusting tunable capacitors distributed around the coil while loaded with an average patient in a standard position. However, the load of an actual patient is often different from the average. Further, coupling to a body coil with the local coil, particularly when the local coil is wireless or a different type of coil than the whole body coil, can vary from patient to patient and position to position. Commonly used coil types include loop and birdcage. Individual antennas are carefully tuned, matched and decoupled from each other. The amplitude and phase on each antenna is adjusted to achieve a desired $B_1$ excitation pattern. When the local coil is more complicated, such as adding more coil elements as typically found in coil arrays, the interactions become more complicated. For example, in more complex coils, resonance mode in addition to the desired mode can be and are excited. Unintended transmit modes cause unintended spin excitation and field manipulation modes. These effects cause severe degradation in the resonance signal quality.

The present application provides a new and improved inductively coupled local RF coil with a controllable load which overcomes the above-referenced problems and others.

In accordance with one aspect, the inductively coupled local radio frequency coil includes radio frequency (RF) coil elements and a control unit. The RF coil elements include an adjustable load, adjusted by changes in capacitance, resistance or impedance. The control unit includes a load controller, and a communications interface. The load controller controls adjustments of the load. The local power source supplies power to the load controller. The communications interface communicates between the load controller and an off-coil controller.

In accordance with another aspect, a method of magnetic resonance begins by positioning the subject and the local transmit coil in an examination region of a magnetic resonance scanner. A $B_1$ field distribution is determined for each coil element of the local transmit coil. Adjustments are then made to the load in each coil element to adjust the $B_1$ field distribution for each coil element. A magnetic resonance sequence is then performed using the local transmit coil.

One advantage is that the local RF coil can be tuned to the actual load present during a magnetic resonance examination.

Another advantage resides in control of transmit RF frequency and phase.

Another advantage resides mixing different types of whole body coils and local coils.

Another advantage resides in facilitating the use of more complex coils.

Another advantage resides in a time multiplexed parallel imaging protocol.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

FIG. 1 diagrammatically illustrates a MRI system with an inductively coupled wireless local RF coil shown in partial cross section to diagrammatically reveal selected internal components.

FIG. 2 diagrammatically illustrates a detailed view of the inductively coupled local RF coil with controllable load shown in a wireless configuration with a measuring device and a single coil element.

FIG. 3 diagrammatically illustrates a cut-away view of the inductively coupled local RF coil with controllable load shown in a wireless configuration with a single control unit and an array of coil elements.

FIG. 4 diagrammatically illustrates a cut-away view of the inductively coupled local RF coil with controllable load shown in a wireless configuration with individual control units for each element and an array of coil elements.

Figure 1:
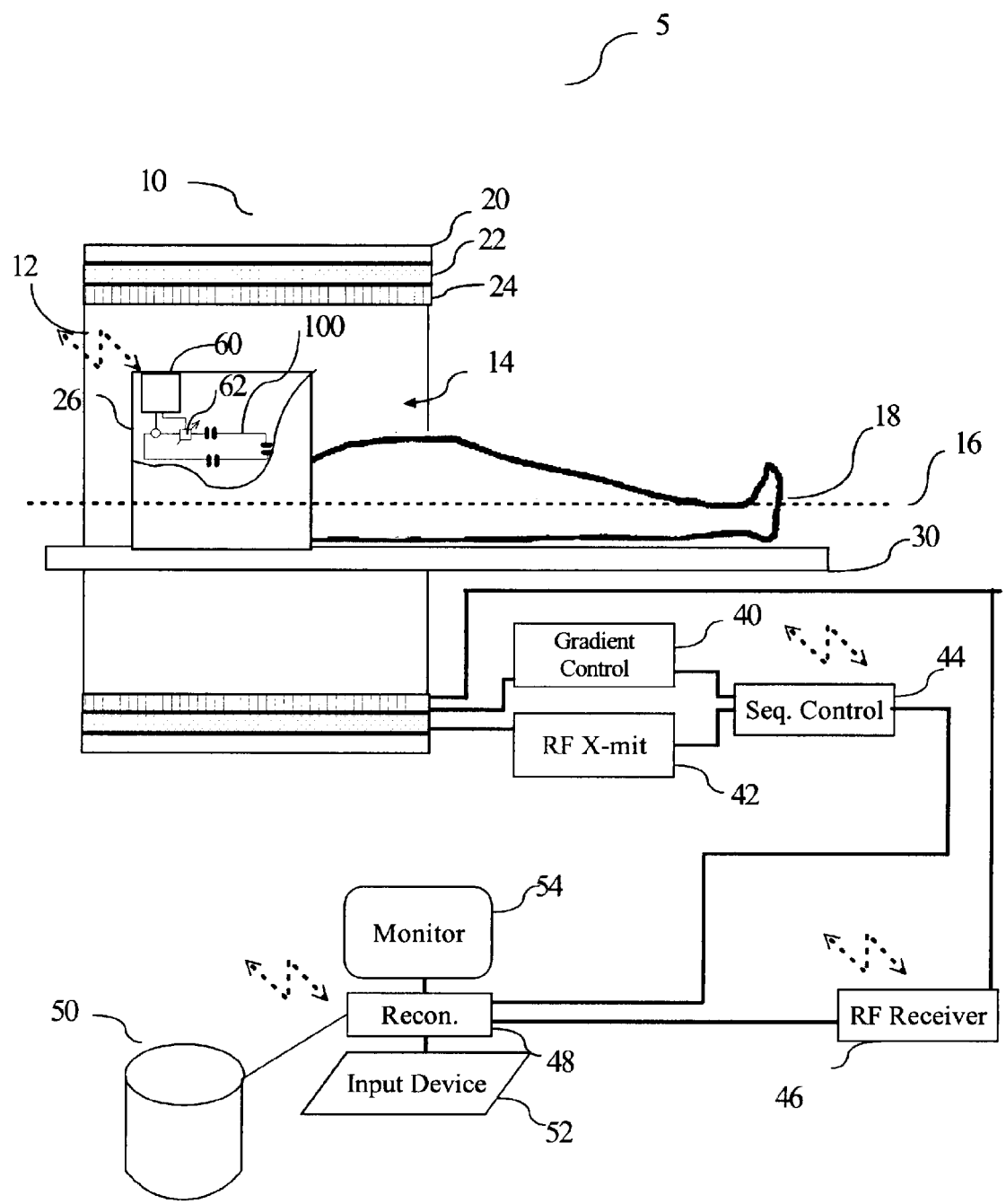

With reference to FIG. 1, a magnetic resonance (MR) system 5 includes an MR scanner 10 which has a generally cylindrical or toroidal housing 12. The housing 12 defines a bore 14 that is concentric with a cylinder or toroid axis 16 of the housing 12. A subject 18 is received in an examination region of the bore 14 for an imaging and/or spectroscopy procedure. A main magnet 20 defined by solenoidal conductive windings generates a static ($B_0$) magnetic field with the field direction generally parallel with the cylinder or toroid axis at least within the examination region of the bore 14. The windings of the main magnet 20 may be resistive or superconducting; in the latter case, the windings are typically disposed in a cryostat (not shown) containing helium or another suitable cryogenic fluid.

The housing 12 further contains or supports a plurality of magnetic field gradient windings 22 for superimposing magnetic field gradients in selected directions within the examination region of the bore 14. The magnetic field gradients are in general time-varying. As an illustrative example, a slice-selective magnetic field gradient may be applied along the axis 16 of the bore during magnetic resonance excitation to select a transverse axial slice, followed by a phase-encoding magnetic field gradient applied transverse to the axial slice, followed by a readout magnetic field gradient is applied in a direction transverse to both the axis 16 and the phase encoding direction. Although a bore type MR system is illustrated, it is to be appreciated that open systems, C-magnet systems, and the like are also contemplated.

The magnetic resonance excited by applying a radio frequency ($B_1$) pulse at the magnetic resonance frequency (e.g., 128 MHz for $^1H$ excitation in a 3.0 T field) to one or more radio frequency coils 24. In the illustrative embodiment, the radio frequency coil 24 includes a "whole-body" volume coil such as a birdcage coil or transverse electromagnetic (TEM) coil arranged on or in the housing 12 concentric with the axis 16. A local coil, illustrated as a head coil 26, by way of example is used for the MR excitation in the examination region. Other types of local coils or coil arrays, such as limb coil, surface coil or so forth are also contemplated. Additionally, the local coil may be coupled to a subset of the whole-body coil or a quadrant body coil.

In the illustrated embodiment, a patient handling system includes a patient couch 30 arranged at an end of the housing 12 which moves the patient into and positions the patient within the bore 14 of the MR scanner 10. The MR system further includes a gradient coil controller 40 that controls the gradient coils 22 to selectively apply magnetic field gradients across the $B_0$ field. A RF transmitter 42 controls the whole body RF coil 22, in combination with a local head coil 26, to generate $B_1$ radio frequency resonance excitation RF fields in the examination region. A sequence controller 44 controls the gradient coil controller 40, the RF transmitter 42, and the local RF coil 26 to implement selected magnetic resonance or other sequences. The MR scanner 10 further includes a radio frequency (RF) receiver 46 which receives resonance signals picked-up either by the whole body radio frequency coil 24 or the one or more local coils 26. The receiver demodulates the received resonance signals which are reconstructed by a processor 48 to generate an image representation, spectroscopic information, or the like, which is stored in an image memory 50. An operator selectively withdraws portions of the image representation from the image memory using an input device 52, which is converted by a processor 48 into appropriate format for display on a monitor 54.

With continuing reference to FIG. 1, the local RF coil 26 has an RF transceiver within the control unit 60 which receives signals from the sequence control 44 to control transmission or reception of the RF signals to and from the main body coil and to control one or more adjustable loads 62. The RF signal transmitted by the local coil is determined by stored settings. Signals received by the local RF coil 26 are then transferred by the control unit 60 using a wireless protocol for image processing.

Figure 2:
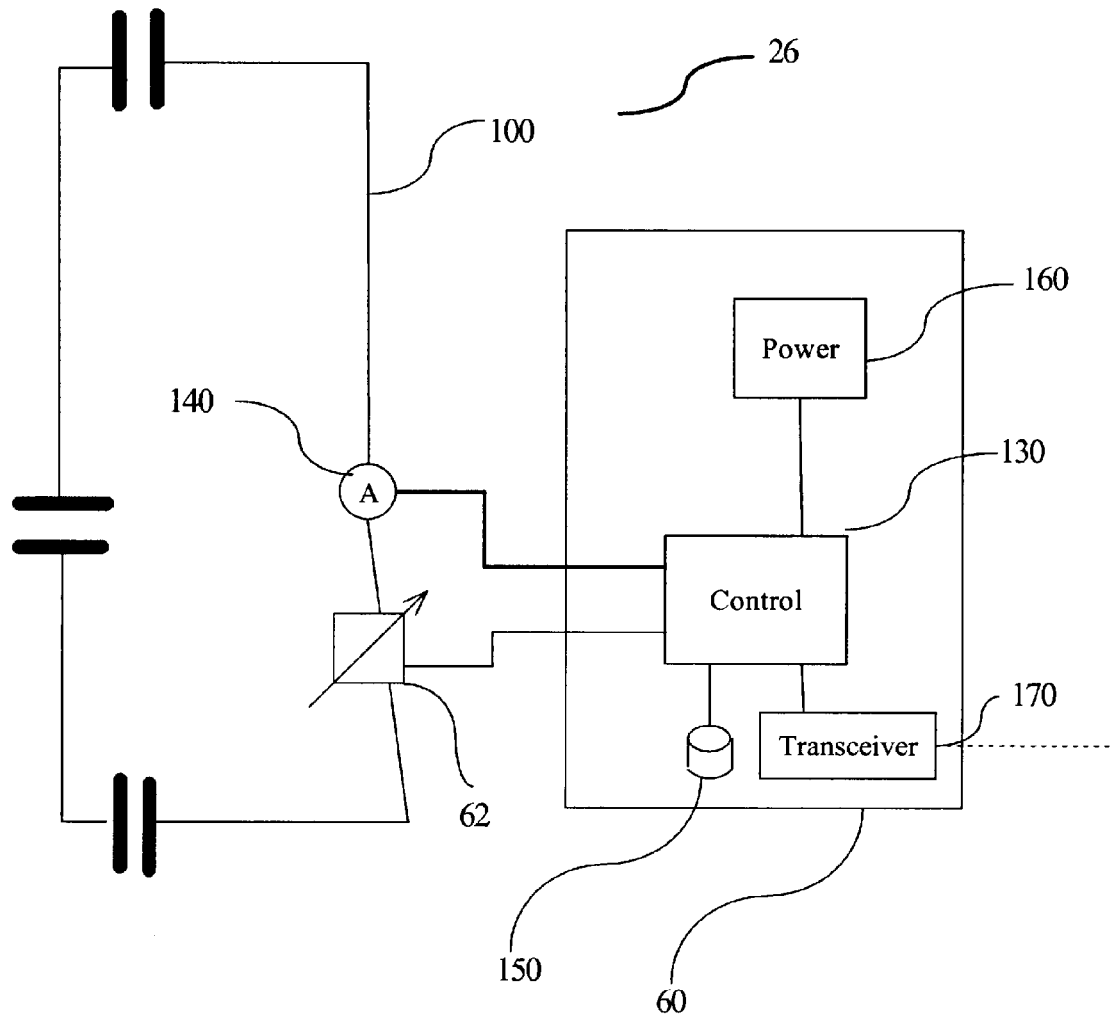

With reference to FIG. 2, the inductively coupled local RF coil 26 has a plurality of coil elements. One of the controllable loads is connected with a coil element 100 and the control unit 60. The coil element 100 may be a loop, TEM, birdcage, or other coil element. In a transmit mode, the load control unit 60 adjusts the load 62 on the coil element by changes in capacitance, resistance, and/or impedance. The load 62 can also include transistors and/or switches for switching electrical elements into or out of the load. In another embodiment, the inductance, resistance, and/or capacitance of the load is adjusted continuously or in incremental steps, such as with a varicap element, a MEMS device, or the like. Changes in the load are determined by a controller 130, e.g. a microprocessor based controller in the control unit in one embodiment in response to current measured on the coil element through a sensor or ammeter 140. In another embodiment, the load is determined in response to signals from the sequence control 44 without a separate measuring device. The settings are stored in a memory 150 and communicated to the controller 130 at the appropriate time. A power supply 160 for the controller 130 in one embodiment includes power harvesting circuit which inductively harvests power from the main coil 20 and stores the power, e.g. in a rechargeable battery. Alternatively, the power supply 160 includes a disposable battery, a rechargeable battery, or is physically connected to an external power source. Another embodiment uses the coil element 100 to directly harvest power from the main coil 20 without a local power supply. A wireless interface 170 receives control instructions regarding the $B_1$ fields to be applied from the sequence control 44. In a receive mode, the transceiver transmits received resonance signals. The local coil can be used to modulate the envelope of the carrier frequency from the whole body coil in both amplitude and phase.

Simple pick-up probes can be placed near the antenna elements at locations of interest. A simple envelope detector can be used to monitor the magnitude of the current. Both magnitude and phase of the current can be monitored by adding a local oscillator. This local oscillator can also be supplied wireless via a harmonic frequency.

Figure 3:
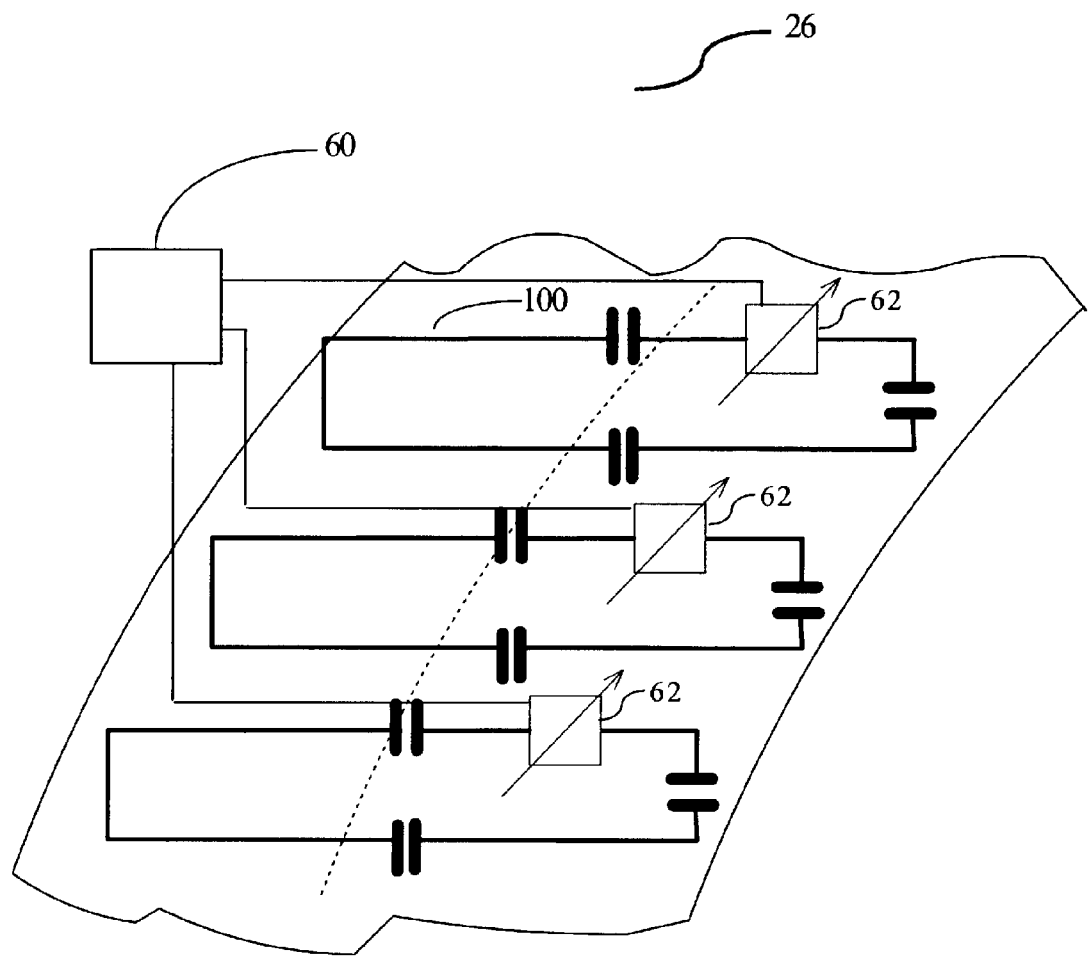

With reference to FIG. 3, the inductively coupled local RF coil 26 in another embodiment includes an array of coil elements 100. The coil elements are either configured as loops or TEMs. A single control unit 60 operates an array of the coil elements 100 each with its own adjustable load 62. Each adjustable load 62 is individually addressable by the control unit. The optimal settings for the loads are determined by the control 44 and communicated to the coil control unit 60 through the wireless interface 170.

In another embodiment, each coil unit includes the current sensor 140. By adjusting phase and amplitude on the individual coil elements with the adjustable load 62, a desired $B_1$ excitation pattern can be approximated. The amplitude and phase can be monitored during adjustment with the current sensor 140, with magnetic resonance calibration sequences, or the like. This approach is usually referred to as $B_1$ shimming.

Figure 4:
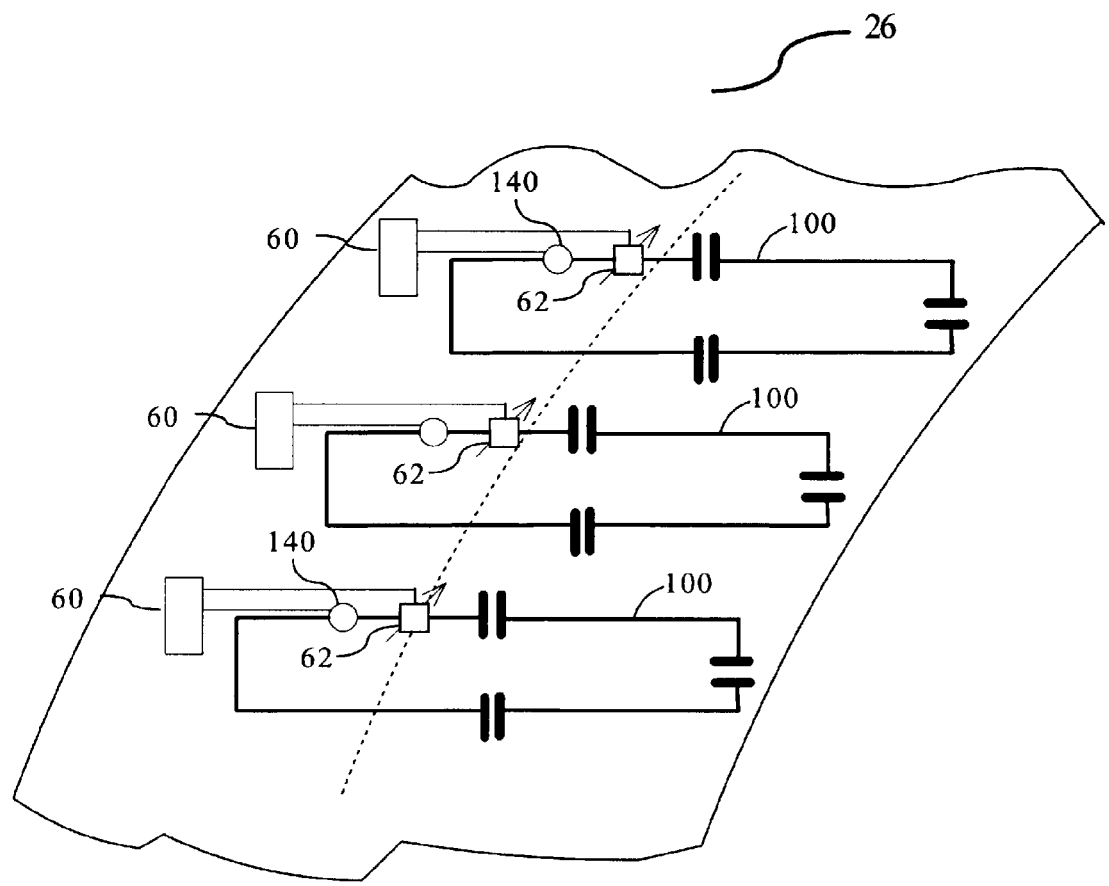

With reference to FIG. 4, the inductively coupled local RF coil 26 in another embodiment includes an array of the coil elements 100 each with the adjustable load 62, a current sensor 140, and a separate coil control unit 60. Of course, the coil elements can be controlled by a single controller like FIG. 3. The coil control unit 60 of FIG. 3 or 4 can adjust or switch the characteristics of the load concurrently, sequentially, individually, with delay patterns, and the like. The loads can be selected to detune the local coils during transmit, compensate for subject loading, and the like. By turning on different combinations of coil elements, different degrees of tuning freedom are achieved. Modulating loads during transmission can be used to alter the amplitude and the phase of the $B_1$ field, for example to achieve an envelope in the form of a synch function. Different modulations on different elements achieve a multidimensional $B_1$ field distribution, which facilitates various imaging techniques, such as parallel imaging, e.g. SENSE. The loads can be changed sequentially to different local $B_1$ field distributions, e.g. with higher amplitudes, to perform SENSE or other parallel imaging techniques serially, rather than concurrently.

Figure 5:
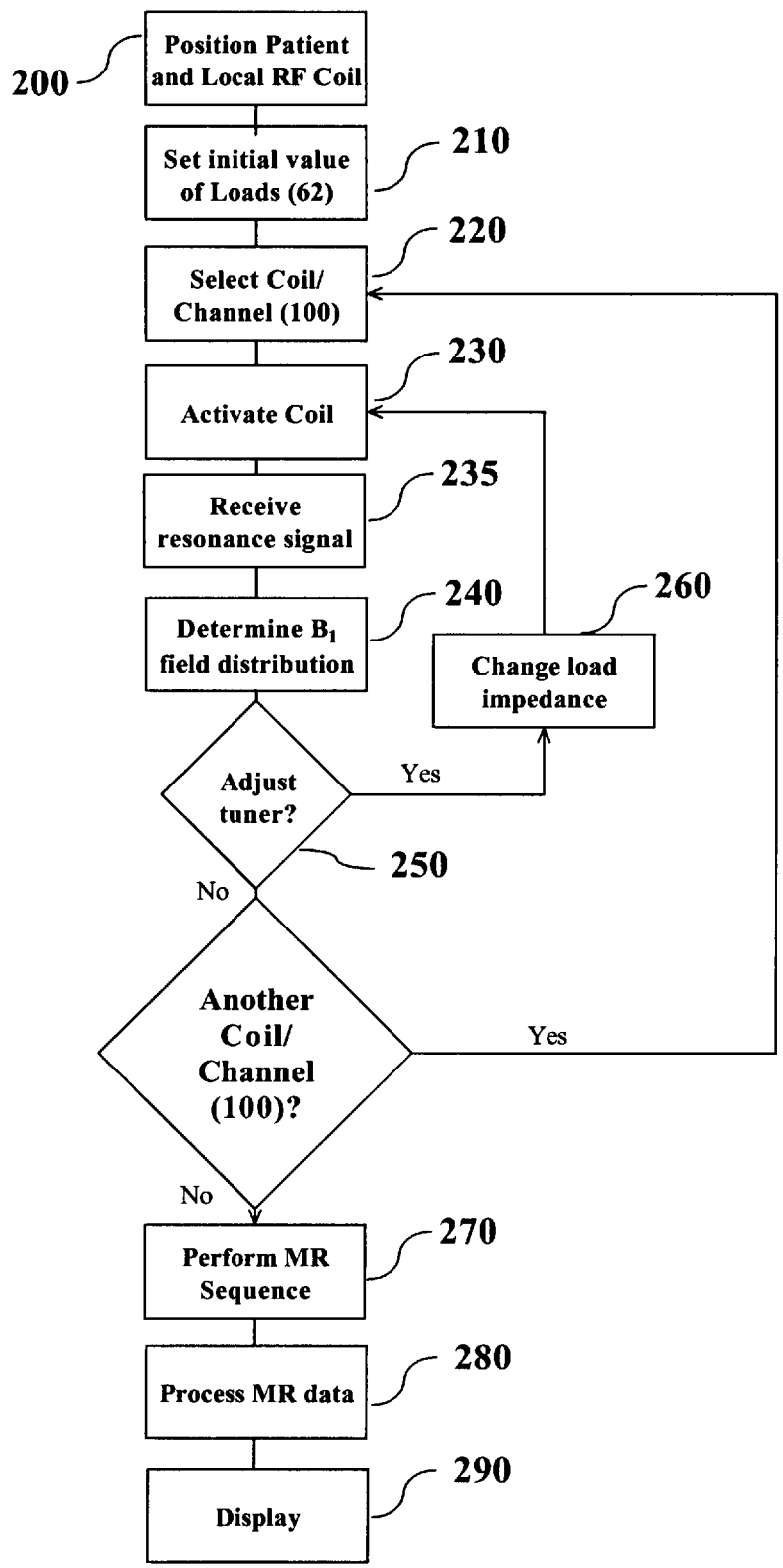
FIG. 5 is a flowchart of a $B_1$ shimming method for using the inductively coupled local RF coil with controllable load in which the load is adjusted to shim the $B_1$ field to achieve a uniform $B_1$ field distribution for each individual subject prior to examination.

With reference to FIG. 5, the patient and the local coil are positioned 200 in the examination region of the MR scanner 10. An initialization 210 of the coil elements sets an initial load 62 for each coil element 100. Each coil element is connected to a control unit 60 which communicates using a wireless protocol 170 with the sequence control to select initial loads for each coil element, e.g. based on prior patient scans, patient weight, scanner characteristics, or the like. After selecting one or more coil elements to shim, the whole body coil 24 transmits 230 a $B_1$ field pulse. The select coil element 100 adjusts the $B_1$ field distribution delivered to the patient. The coil element(s) 100 then switch to receive mode to receive resonance signals. Coil elements 100 receive the resonance signals. Evaluating the received resonance signals allows the control unit 60 or control unit 44 to determine 250 whether adjustments 260 are needed to the load to achieve the desired $B_1$ field distribution. This calibration sequence is iteratively repeated until an optimal $B_1$ distribution for each coil element 100 is achieved. Coil element can be tuned sequentially or in parallel.

Once the desired loads 62 are set for each coil element 100 to satisfactorily shim the $B_1$ field, the system 5 performs 270 a MR sequence. The local coil 26 receives the resonance signals which are processed 280 by the processor 48 into an image, spectroscopic information, or the like for display 290 on the monitor 54, storage in computer memory or the like.

Alternatively, the coil can be shimmed in a factory or installation procedure and not refined for each patient.

Figure 6:
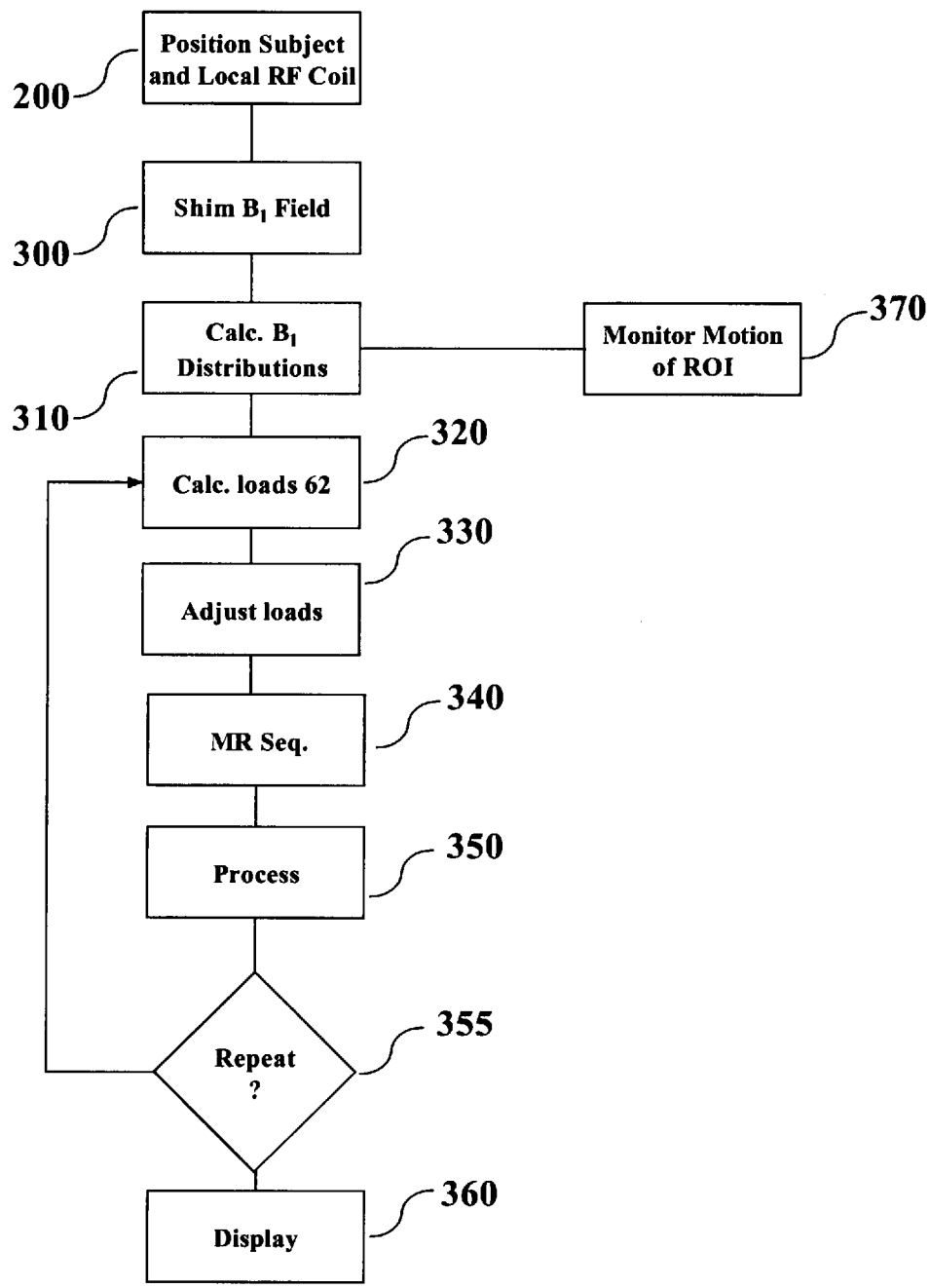
FIG. 6 is a flowchart of a method for using the inductively coupled local RF coil with controllable load in which the load is adjusted for imaging sequences that use non-uniform $B_1$ field distributions.

With reference to FIG. 6, some imaging sequences call for non-uniform $B_1$ distributions. In one embodiment, two close-by regions of the patient are to be imaged. The patient is positioned 200 with the two regions of interest in the local coil 26 in the imaging region 14. The $B_1$ field is shimmed 300, e.g. by the method of FIG. 5 to achieve a uniform $B_1$ field distribution.

The sequence controller 44 calculates 310 a first non-uniform $B_1$ field distribution which focuses the $B_1$ first on the first region of interest and a second $B_1$ field distribution which focuses the $B_1$ field on the second region of interest. From the desired $B_1$ field distribution, the controller 130 or the sequence controller 44 determines 320 the corresponding loads, e.g. by looking up pre-calculated values in the memory 150 or by calculating. The controller 130 adjusts 330 the loads accordingly. For example, the load is adjusted to focus the $B_1$ field on the first region and an MR sequence is performed 340. The data is processed 350, e.g. reconstructed, and an image is displayed 360 on the monitor 54 or stored in memory. While the MR data is being processed, the loads are adjusted 330 to focus on the second region of interest and the MR sequence is performed 340 again. If there are additional regions of interest, the loads are again adjusted 320 and the MR sequence performed again.

In one embodiment, the two regions are two organs, e.g. a left or right breast. In another embodiment, the regions of interest are slices.

In another embodiment, the process is used to correct for patient motion. A motion monitor (not shown) monitors 370 movement of the region of interest. As the region of interest moves, the $B_1$ distribution is recalculated 310 to focus the $B_1$ field on the current position of the region of interest. The loads are determined 320 and adjusted during the MR sequence to adjust the sequence in real time for movement of the patient.

In another embodiment, other non-uniform $B_1$ field distributions are selected as is appropriate to the MR sequence to be performed. Multi-dimension $B_1$ field distributions are used in parallel imaging techniques, such as transmit SENSE. The appropriate multi-dimension $B_1$ field distribution for each coil element 100 is determined 310, such as by looking up in memory 150 or a look-up table. Again, the load for each coil element is calculated 320 and adjusted 330 and the parallel imaging sequence is performed 340. Alternatively during RF excitation, load impedance of each coil element changes independently.

In parallel imaging, each coil typically has a different $B_1$ distribution to accelerate the imaging speed. In a time division multiplexed parallel imaging embodiment, a common $B_1$ field distribution is calculated 310 for a plurality, in some embodiments all, of the coil elements 100. The MR sequence is performed 340 to generate part of the MR data. Then for a subsequent $B_1$ excitation of the sequence, a different $B_1$ field is determined 310 and the loads calculated 320 and adjusted 330. The process is continued until a selected number of different $B_1$ field distributions have been applied. Time division multiplexing is advantageous because by transmitting each $B_1$ distribution with a plurality of coil elements higher $B_1$ field strengths are achieved. But, a time penalty is paid because the various $B_1$ field distributions are applied sequentially or serially.

The local coil transmits inductively with the whole body coil. The control units of the local coil are turned off to allow receiving of resonance signals through the coil elements. The control units are then turned on to allow processing of the resonance signals received, to make adjustments to the loads of individual coil elements, and to transmit the received resonance signals to the system for image reconstruction.

It is also envisioned that the local transmit fields of the local coil elements are combined with the transmit fields of the body coil in various ratios. Low coupling would provide a transmit field that is dominated by the field of the body coil, while strong coupling would provide a transmit field that is dominated by the local transmit elements.

If the loads are modulated during the transmit cycle, different envelope functions are generated for each channel, thereby enabling SENSE like applications with a wireless transmit array powered by a single body coil. Rapidly turning local array elements on and off produces a time division multiplexed sensitivity encoding.

This technique is not limited to MR scanners. It can be extended to any form of antenna array where it is desired to have either a beam shaping function or the ability to perform local modulation on a set of passively coupled antenna elements.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

Having thus described the preferred embodiments, the invention is now claimed to be:

1. A magnetic resonance system comprising:
   a main magnet which generates a static ($B_0$) magnetic field in an examination region;

magnetic field gradient coil which superimposes time varying magnetic field gradients on the $B_0$ in selected directions within the examination region;

a whole body radio frequency coil which generates radio frequency ($B_1$) pulses; and a local radio frequency coil inductively coupled to the whole body radio frequency coil, the inductively coupled local radio frequency coil for a magnetic resonance system comprising:

a plurality of radio frequency coil elements each including an adjustable load, the load having at least one of an adjustable capacitance, resistance or impedance; and a control unit which includes:
   a load controller which controls adjustments of the load; and
   a communications interface connected to the load controller which communicates between the load controller and an off-coil controller.

2. The system according to claim 1, wherein each radio frequency coil element further includes:

a measuring device connected to the control unit, the measuring device measuring current on the radio frequency coil element; and wherein the load controller compares the measured current with a selected current and adjusts at least one of the capacitance, resistance, and impedance of the load accordingly.

3. The system according to claim 2, wherein the load controller compares the measured current with a selected current and adjusts at least one of the capacitance, resistance, and impedance of the load accordingly.

4. The system according to claim 1, wherein the load controller compares at least one of a measured frequency and phase of a transmitted radio frequency signal to at least one of a selected frequency and phase.

5. The system according to claim 1, wherein each radio frequency coil element is connected with a different control unit to be individually controlled.

6. The system according to claim 1 further including:
a local power source which harvests power from the magnetic resonance system.

7. The system according to claim 1, wherein the communications interface connects wirelessly with the control.

8. The system according to claim 1, wherein the communications interface connects to the control with a fiber optic cable.

9. The system according to claim 1, wherein the coil element includes at least one of: a loop coil, and a transverse electromagnetic (TEM) array.

10. The system according to claim 1, wherein the control unit further includes:
a computer memory connected the load controller which stores at least one of:
adjustment configurations for the loads, and
software which controls operation of the load controller.

11. A magnetic resonance system comprising:
a main magnet which generates a static ($B_0$) magnetic field in an examination region;

magnetic field gradient coil which superimposes time varying magnetic field gradients on the $B_0$ in selected directions within the examination region;

a whole body radio frequency coil which generates radio frequency ($B_1$) pulses; and the local radio frequency coil according to claim 1 inductively coupled to the whole body radio frequency coil.

12. A magnetic resonance method comprising:
a) positioning a subject and a local transmit coil inductively coupled to a whole body coil of a magnetic resonance scanner in an examination region of the magnetic resonance scanner;
b) determining a $B_1$ field distribution for each coil element of the local transmit coil;
c) adjusting a load in each coil element of the local transmit coil to adjust the $B_1$ field distribution for each coil element;
d) performing a magnetic resonance sequence using the local transmit coil.

13. The method according to claim 12 wherein the local transmit coil is inductively coupled with the whole body coil and performing the imaging sequence includes transmitting with the whole body coil and the local transmit coil concurrently.

14. The method according to claim 12, further including:
e) transmitting a radio frequency signal into the examination region;
f) measuring at least one of a frequency, an amplitude, and a phase of the transmitted signal;
g) adjusting the load of one or more of the coil elements based on a deviation between the measured and a preselected current, frequency, amplitude, and/or phase;
h) repeating steps e)-g) for one or more of the coil elements.

15. The method according to claim 14 comprising:
iteratively repeating step h) until the $B_1$ field in the examination region is substantially uniform.

16. The method according to claim 12, further including:
measuring a current on each coil element; and
adjusting the load based on the measured current.

17. The method according to claim 12 further including:
before performing each magnetic resonance sequence, adjusting the loads to produce one or more selected non-uniform $B_1$ field distributions during the magnetic resonance sequence.

18. The method according to claim 12 further including:
during the magnetic resonance sequence and/or during the magnetic resonance excitation, adjusting the loads to change the $B_1$ field distribution in the examination region.

19. The method according to claim 18 wherein the loads are changed to apply a series of parallel imaging $B_1$ field distributions sequentially to achieve a time division multiplex sensitivity encoding.

20. A non-transient computer readable medium carrying software which controls one or more processors to perform the method according to claim 12.

* * * * *